(12) United States Patent
Lin

(10) Patent No.: US 6,466,442 B2
(45) Date of Patent: Oct. 15, 2002

(54) GUIDABLY-RECIRCULATED HEAT DISSIPATING MEANS FOR COOLING CENTRAL PROCESSING UNIT

(76) Inventor: Ching-Bin Lin, 2F-2, No. 12, Lane 88, Min-Sheng E. Road, Sec. 3, Taipei (TW)

( * ) Notice: Subject to any disclaimer, the term of this patent is extended or adjusted under 35 U.S.C. 154(b) by 28 days.

(21) Appl. No.: 09/773,327

(22) Filed: Jan. 29, 2001

(65) Prior Publication Data

US 2002/0101717 A1 Aug. 1, 2002

(51) Int. Cl.[7] .............................................. H05K 7/20
(52) U.S. Cl. ...................... 361/695; 361/692; 361/697; 257/719; 165/104.33
(58) Field of Search ................................. 361/687, 692, 361/695–699, 700–710, 688, 711; 257/719, 722, 715; 174/15.1, 16.3, 15.2; 165/46, 104.33, 104.21, 104.22, 104.34, 104.26, 104.27, 185, 80.3, 80.4; 62/259.2; 454/184; 29/890.032

(56) References Cited

U.S. PATENT DOCUMENTS

| | | | | |
|---|---|---|---|---|
| 3,673,306 A | * | 6/1972 | Kirkpatrick | 174/15 R |
| 3,789,920 A | * | 2/1974 | Low et al. | 165/105 |
| 3,800,190 A | * | 3/1974 | Marek | 317/234 R |
| 3,857,441 A | * | 12/1974 | Arcella | 165/105 |
| 3,865,184 A | * | 2/1975 | Grover | 165/105 |
| 3,955,619 A | * | 5/1976 | Corman et al. | 165/105 |
| 3,971,435 A | * | 7/1976 | Peck | 165/78 |
| 4,012,770 A | * | 3/1977 | Pravda et al. | 357/82 |
| 4,212,349 A | * | 7/1980 | Andros et al. | 165/105 |
| 4,633,371 A | * | 12/1986 | Nagy et al. | 361/385 |
| 4,951,740 A | * | 8/1990 | Peterson et al. | 165/32 |
| 4,966,226 A | * | 10/1990 | Hamburgen | 165/104.26 |
| 5,219,021 A | * | 6/1993 | Edelstein et al. | 165/104.26 |
| 5,412,535 A | * | 5/1995 | Chao et al. | 361/700 |
| 5,632,158 A | * | 5/1997 | Tajima | 62/259.2 |
| 5,871,043 A | * | 2/1999 | Osakabe et al. | 165/104.21 |
| 6,085,831 A | * | 7/2000 | DiGiacomo et al. | 165/104.33 |
| 6,330,908 B1 | * | 12/2001 | Lee et al. | 165/185 |
| 6,336,497 B1 | * | 1/2002 | Lin | 165/80.3 |

* cited by examiner

Primary Examiner—Gerald Tolin
Assistant Examiner—Michael Datskovsky

(57) ABSTRACT

A heat dissipating device includes: a barrel having a plurality of fins formed on the barrel and having a buckle for fastening the barrel to a base board of a central processing unit (CPU) to conduct heat from CPU towards the barrel; a cooling fan contiguous to the fins and the barrel for cooling the fins and the barrel; a vaporizable coolant filled in the barrel; a guiding device provided in the barrel for guiding and ejecting the vapor as vaporized from a liquid coolant when absorbing the heat from CPU towards a cooled inside wall of the barrel to be condensed as a liquid coolant; and a capillary device formed on the inside wall for capillarily osmetically draining the liquid coolant towards a bottom of the barrel for enhancing a liquid-vapor two phase recirculation of the coolant for efficiently dissipating heat from the CPU.

4 Claims, 3 Drawing Sheets

US 6,466,442 B2

GUIDABLY-RECIRCULATED HEAT DISSIPATING MEANS FOR COOLING CENTRAL PROCESSING UNIT

BACKGROUND OF THE INVENTION

This application is a continuation-in-part (C-I-P) of the U.S. Patent application entitled "Self-recirculated Heat Dissipating Means for Cooling Central Processing Unit" (hereinafter defined as "Prior Application") filed on: Nov. 24, 2000 by the same inventor of this application.

The prior application disclosed a heat dissipating device for cooling central processing unit (CPU) by filling a vaporizable coolant in a barrel having fins and cooling fan provided on the barrel; whereby upon absorption of heat from CPU, the coolant will absorb heat of vaporization to become vapor which is then contacted with the barrel wall as cooled by the fan to be condensed as a liquid coolant for completing a liquid-vapor two phase recirculation for dissipating the heat from CPU.

However, the prior application did not disclose any capillary device for capillarily draining the condensed liquid coolant into the bottom portion of the barrel, thereby influencing the heat dissipating efficiency for removing heat from the CPU.

The present inventor has found the drawback of the prior application and invented the present heat dissipating means for guidably recirculating the coolant for increasing the heat dissipating efficiency for cooling CPU.

SUMMARY OF THE INVENTION

The object of the present invention is to provide a heat dissipating device including: a barrel having a plurality of fins formed on the barrel and having a buckle for fastening the barrel to a base board of a central processing unit (CPU) to conduct heat from CPU towards the barrel; a cooling fan contiguous to the fins and the barrel for cooling the fins and the barrel; a vaporizable coolant filled in the barrel; a guiding device provided in the barrel for guiding and ejecting the vapor as vaporized from a liquid coolant when absorbing the heat from CPU towards a cooled inside wall of the barrel to be condensed as a liquid coolant; and a capillary device formed on the inside wall for capillarily osmetically draining the liquid coolant towards a bottom of the barrel for enhancing a liquid-vapor two phase recirculation of the coolant for efficiently dissipating heat from the CPU.

DETAILED DESCRIPTION

Figure 1:
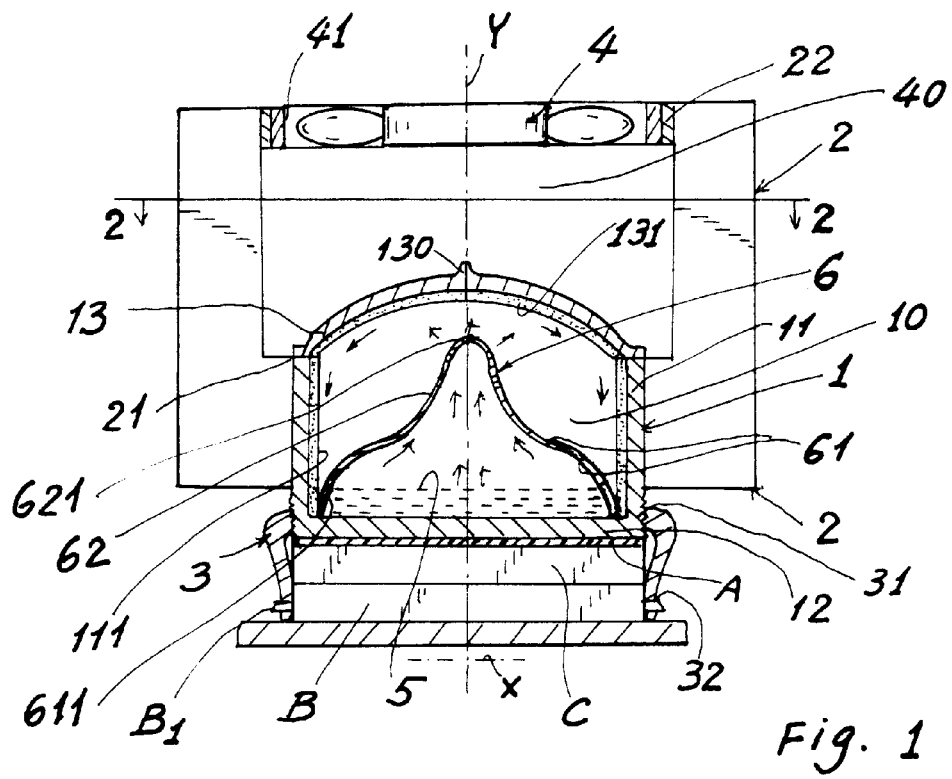
FIG. 1 is a sectional drawing of the present invention.

As shown in FIGS. 1, 2, 3 and 6, a heat dissipating means for cooling central processing unit (CPU) of the present invention comprises: a barrel 1; a plurality of fins 2 formed on the barrel 1; a plurality of fins 2 formed on the barrel 1; a buckle 3 for fastening the barrel 1 to a base board B of the central processing unit (CPU) C to allow a bottom wall 12 of the barrel 1 to thermally contact the CPU; a cooling fan 4 secured to the fins 2 or secured to the barrel 1; a vaporizable coolant 5, which may be selected from water or other coolants or solvents vaporizable at low temperature or at low pressure, filled in the barrel 1 which is evacuated to form vacuum before the filling of the coolant 5; a guiding means 6 provided in the barrel 1 for guiding the vapor as vaporized from a liquid coolant 5 and ejecting the vapor towards an inside wall of the barrel 1 to be cooled and condensed at the inside wall of the barrel 1; and a capillary means 131, 111 formed on the inside wall of the barrel 1 for capillarily osmetically draining the liquid coolant as condensed at the inside wall of the barrel 1 towards the bottom wall 12 of the barrel 1.

Figure 3:
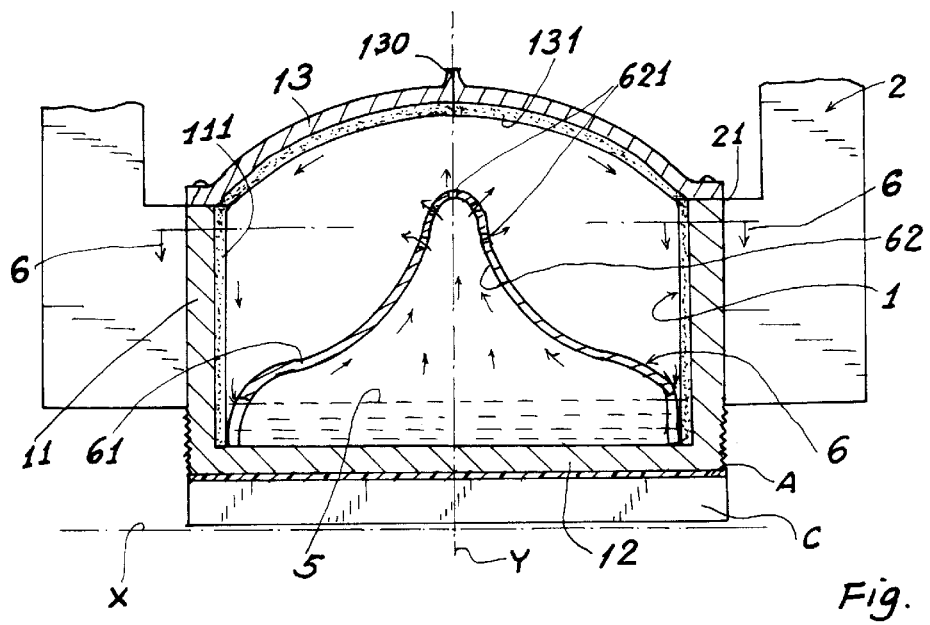
FIG. 3 is a sectional drawing of the present invention as partially enlarged from FIG. 1.

The barrel 1 defines a longitudinal axis Y at a longitudinal center of the barrel 1 to be perpendicular to a horizontal axis X (FIG. 3). The barrel 1 may be comprehensively referred to a hollow body, a container, a casing, a tube or the like.

The barrel 1, and the fins 2 should be made of heat conductive materials, for example, aluminum alloys. The barrel 1 may be formed as cylindrical or tubular shape, but not limited in the present invention.

The barrel 1 includes: a bottom wall 12 closely connected, fastened or adhered with the base board B of CPU (C) by thermally conductive adhesive A; a side wall 11 circumferentially integrally formed with the bottom wall 12; and an end cover 13 distal from the bottom wall 12 and sealably capping the side wall 11 to define a chamber 10 among the bottom wall 12, the side wall 11 and the end cover 13.

The chamber 10 in the barrel 1 may be evacuated to form vacuum after or before filling the coolant 5 in the barrel 1 by sucking air outwardly through a vent 130 formed in the end cover 13.

Figure 2:
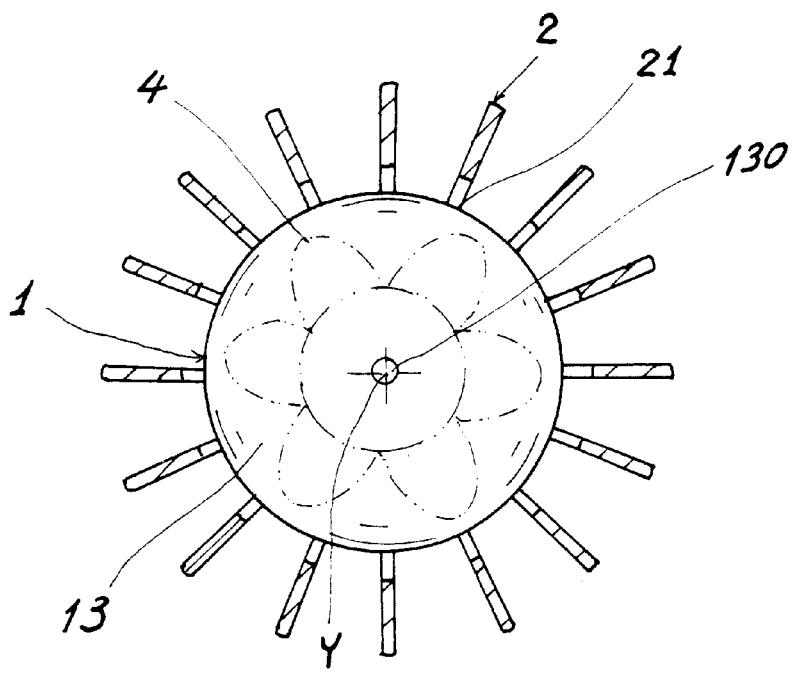
FIG. 2 is a cross sectional drawing as viewed from 2—2 direction of FIG. 1.

Each fin 2 has a proximal end 21 secured to or integrally formed on the barrel 1. The cooling fan 4 is secured to a distal end 22 of the fin 2. As shown in FIGS. 1, 2, the fins 2 may be radially disposed about the barrel 1 or the barrel 1 is positioned in a central portion of the fins 2. The fan 4 may also be secured in a central portion of the fins 2 by securing a fan frame 41 on the distal ends 22, which may be formed as a ferrule, of the fins 2. The fan 4 is positioned above or apart from the barrel 1 to define a cooling-air chamber 40 among the end cover 13 of the barrel 1, the fins 2, and the fan 4 as shown in FIG. 1. The fan 4 has its center coaxial to the longitudinal axis Y of the barrel 1. So, the cooling air of axial flow may be driven by the fan 4 to cool down the barrel 1 and the fins 2 either by downwardly blowing the cooling air towards the barrel 1 and fins 2; or by upwardly drafting cooling air through the fins 2 and the barrel 1.

The fan 4 may also be mounted on the barrel 1 with suitable frame or fixture (not shown).

The buckle 3 has its one end 31 secured to the barrel 1 and has its fastening end formed with a tenon hole 32 in order to be engaged with a tenon B1 formed on the base board B of CPU (C) as shown in FIG. 1.

The fastening mechanism for fastening the buckle 3, the CPU base board B and the barrel 1 may be modified by those skilled in the art, not limited in the present invention.

The end cover 13 may be formed as a shallow conical shape, semi-spherical shape, arcuate shape, or other shapes.

As shown in FIG. 3, the guiding means 6 includes: a hood portion 61 retained to the bottom wall 12 of the barrel 1 having a plurality of inlet holes 611 formed in a bottom portion of the hood portion 61 to drain liquid coolant from the side wall 11 into the hood portion 61 through the inlet holes 611; and a nozzle 62 tapered from the hood portion 61 towards the end cover 13 having a plurality of perforations 621 formed in the nozzle 62 for guiding vapor, which is vaporized from the liquid coolant 5 in the hood portion 61 when heated by the heat transferred from the CPU (C), towards the end cover 13 and the side wall 11 of the barrel 1 to be cooled and condensed at an inside wall of the end cover 13 and the side wall 11 of the barrel 1.

The capillary means includes: a first capillary layer 131 formed on an inside wall of the end cover 13, and a second capillary layer 132 formed on an inside wall of the side wall 11 and continuously contacted with the first capillary layer 131 for capillarily osmetically draining the liquid coolant, as condensed on the inside walls of the end cover 13 and the side wall 11 of the barrel 1, towards the bottom wall 12 to complete the liquid-vapor two phase change recirculation of the vaporizable coolant 5.

Figure 6:
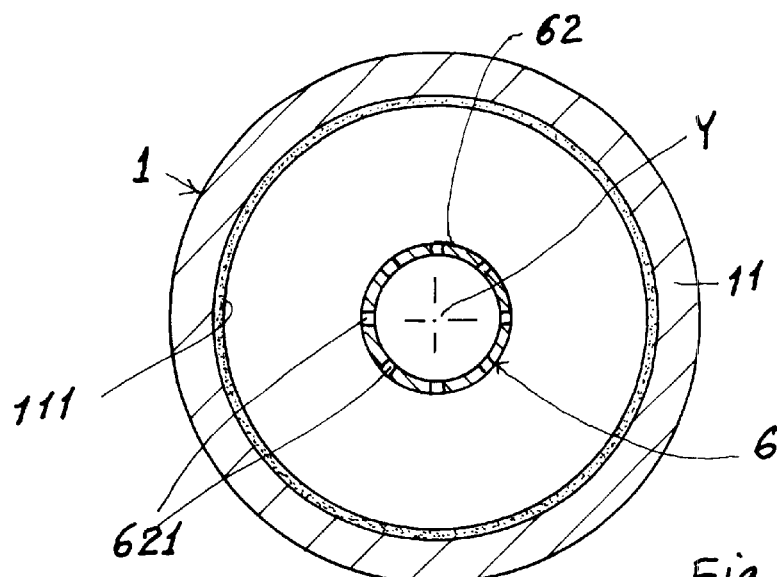
FIG. 6 is a cross sectional drawing of the present invention as viewed from 6—6 direction of FIG. 3.
Figure 7:
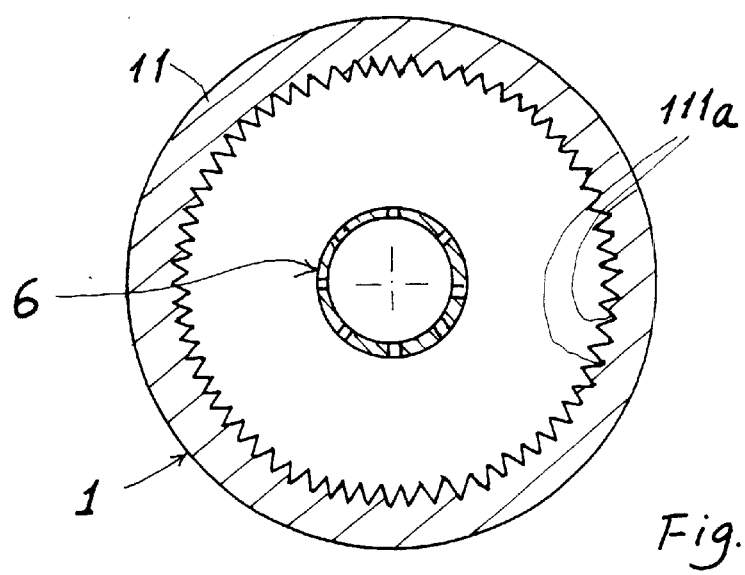
FIG. 7 shows a further modification of the present invention when modified from FIG. 6.

As shown in FIG. 6, the capillary layer 111 or 131 may be made of metal powder metallurgy. Or, the capillary layer 111 or 131 may be formed with a plurality of capillary grooves 111a juxtapositionally formed in the inside wall of the side wall 11 or the cover 13 as shown in FIG. 7.

Figure 8:
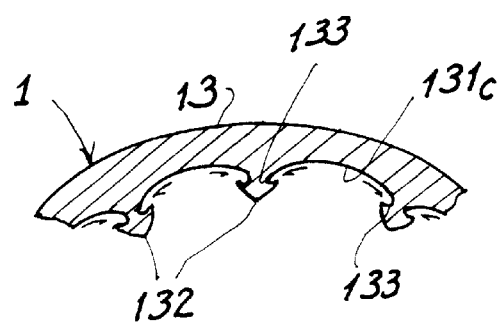
FIG. 8 is a partial sectional drawing of an end cover of a barrel of the present invention, showing a capillary means integrally formed with the end cover.

As shown in FIG. 8, the inside wall of the end cover 13 is formed with a plurality of arcuate recesses 131c raidally or juxtapositionally formed in the inside wall of the cover, and a plurality of ridges 132 radially or juxtapositionally formed in the inside wall of the cover 13, each ridge 132 defined between two neighboring arcuate recesses 131c and having a pair of draining capillary grooves 133 disposed on opposite sides of each ridge 132 for collecting the liquid coolant as condensed on each arcuate recess 131c and draining the liquid coolant downwardly towards the bottom wall 12 through the side wall 11 of the barrel 1.

The shapes of the grooves 111a, 133 of the present invention are not limited. Each ridge 132 may be formed as an arrow shape as shown in FIG. 8 or as other shapes. The inside wall in the end cover 13 and the side wall 11 may also be lined with a porous mesh member for osmetically draining the liquid coolant downwardly.

Figure 4:
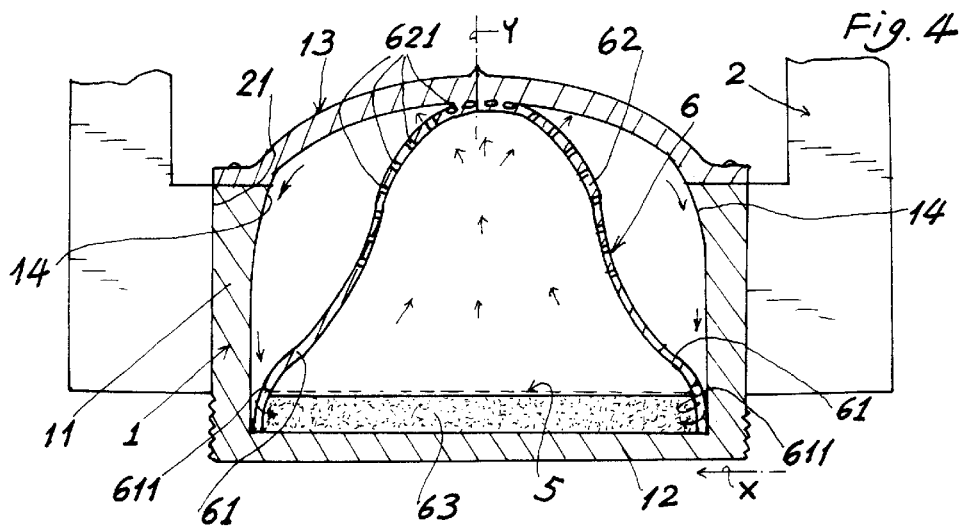
FIG. 4 shows another preferred embodiment of the present invention as modified from FIG. 3.

As shown in FIG. 4, the nozzle 62 of the guiding means 6 may be integrally formed with the end cover 13 for a simultaneous mounting of the cover 13 on the barrel 1 and installation of the guiding means 6 in the barrel 1. A porous absorbent member 63 such as foam, fibrous pad or foamed metal is inserted in the hood portion 61 and laid on the bottom wall 12 of the barrel 1 for quickly absorbing the liquid coolant as condensed and drained through the side wall 11, an arcuate wall portion 14 between the side wall 11 and the end cover 13 formed with arcuate shape.

Figure 5:
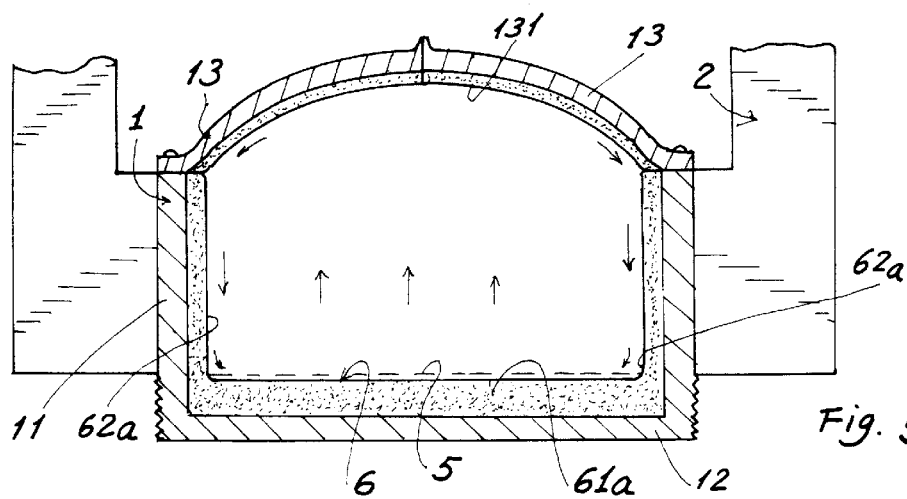
FIG. 5 is a sectional drawing of still another preferred embodiment of the present invention.

As shown in FIG. 5, the guiding means 6 has been simplified to include an absorbent bottom pad 61a laid on the bottom wall 12 and an absorbent side pad 62a connected to the bottom pad 61a and secured or adhered on the inside wall of the side wall 11 for osmetically draining the liquid coolant as drained through the first capillary layer 131 in the end cover 13, through the side pad 62a and then towards the bottom pad 61a for completing the liquid-vapor two phase recirculation.

Upon absorption of the heat transferred from the CPU (C) by the liquid coolant 5 as accumulated in the bottom portion of the barrel 1, the liquid coolant will be vaporized when absorbing the heat of vaporization to become vapor which will then be guided by the guiding means 6 and ejected towards the end cover 13 and the side wall 11 to be cooled and condensed by releasing the heat of condensation which will be dissipated outwardly through the barrel 1 and the fins 2 as cooled by the cooling fan 4.

The vapor of coolant is condensed to be liquid coolant which will be osmetically capillarily drained through the capillary means 131, 111 on the inside walls of the barrel 1 towards the bottom wall 12 of the barrel 1 to thereby complete the circulation of liquid-vapor two-phase change. The liquid vapor phase changes will be automatically recirculated to quickly efficiently dissipate the heat as released from the CPU.

The guiding means 6 plays an important role to guide the coolant vapor towards the cooled inside wall of the cover 13 and side wall 11 of the barrel 1 to be separated from the liquid coolant condensate to prevent "collision" between the coolant vapor and liquid condensate, thereby facilitating the two phase recirculation rate and increasing the cooling effect for cooling CPU.

The capillary means 131, 111 synergistically cooperates with the guiding means 6 to capillarily osmetically drain the liquid condensate of coolant as shown in arrow direction of FIGS. 3~5 to be separated from the vapor ejecting orientations to also facilitate the two phase recirculation rate and increase the efficiency for dissipating the heat from CPU.

Otherwise, the liquid coolant as condensed on the end cover 13 (like a "roof") will gravitationally drop downwardly vertically to collide the upwardly rising vapor, thereby decreasing the recirculation rate.

Accordingly, the present invention will improve the cooling effect for dissipating heat from CPU to be superior to the prior application.

As shown in FIGS. 1, and 3~5, the heat dissipating means of the present invention is vertically erected along the longitudinal axis Y.

If turning the drawing figure of FIGS. 1, 3 and 4 in a right angle by vertically erecting the CPU (C) about the axis X, the present invention will then be horizontally positioned by aligning the axis Y with a horizontal level for a horizontal use of the present invention.

The present invention may be modified without departing from the spirit and scope of the present invention.

If the CPU is a small piece with low load, the barrel 1 may be formed as a shallow cylinder and the guiding means 6 may also be eliminated for saving cost. Also, if the inside wall of the barrel is made as a smooth draining surface for gravitationally draining the coolant downwardly, the capillary layers 131, 111 on the inside wall of the barrel 1 may be eliminated. Moreover, if the coolant is selected from that with low boiling point or high volatility, the chamber 10 in the barrel 1 may not be evacuated to form vacuum.

I claim:

1. A heat dissipating means for cooling central processing unit comprising:

a barrel having a bottom wall contiguous to and thermally conductive with a central processing unit (CPU), and having an end cover distal from said bottom wall for capping a side wall circumferentially formed on said bottom wall for confining a chamber among said bottom wall, said side wall and said end cover of said barrel;

a plurality of fins formed on said barrel;

a cooling fan contiguous to said fins and said barrel for driving a cooling air for cooling said barrel and said fins;

a vaporizable coolant filled into said barrel as evacuated to form vacuum in said chamber;

a guiding means provided in said chamber in said barrel for guiding vapor of the coolant as vaporized when absorbing heat from the CPU towards an inside wall of said barrel to be cooled and condensed as a liquid coolant; and a capillary means formed on the inside wall in said barrel for capillarily osmetically draining the liquid coolant as condensed on the inside wall of the barrel towards the bottom wall for automatically recirculatively completing liquid-vapor two phase change of the coolant for efficiently dissipating heat from the CPU;

said guiding means including: a hood portion retained to the bottom wall of the barrel having a plurality of inlet holes formed in a bottom portion of the hood portion to drain a liquid coolant from the side wall into the hood portion through the inlet holes; and a nozzle tapered from the hood portion towards the end cover having a plurality of perforations formed in the nozzle for guiding vapor, which is vaporized from the liquid coolant in the hood portion when heated by heat transferred from CPU, towards the end cover and the side wall of the barrel to be cooled and condensed at the inside wall of the end cover and the side wall of the barrel.

2. A heat dissipating means according to claim 1, wherein said end cover of said barrel includes an inside wall having a plurality of arcuate recesses juxtapositionally formed in the inside wall of the cover, and a plurality of ridges juxtapositionally formed in the inside wall of the cover, each said ridge defined between every two neighboring arcuate recesses and having a pair of draining capillary grooves disposed on opposite sides of each said ridge for collecting the liquid coolant as condensed on each said arcuate recess and draining the liquid coolant downwardly towards the bottom wall through the side wall of the barrel.

3. A heat dissipating means according to claim 1, wherein said nozzle of the guiding means is integrally formed with the end cover for a simultaneous mounting of the cover on the barrel and installation of the guiding means in the barrel.

4. A heat dissipating means according to claim 1, wherein said guiding means includes a porous absorbent member selected from foam, fibrous pad and foamed metal inserted in the hood portion and laid on the bottom wall of the barrel for quickly absorbing the liquid coolant as condensed and drained through the side wall, and an arcuate wall portion formed between the side wall and the end cover.

\* \* \* \* \*